United States Patent
Chau et al.

[11] Patent Number: 5,855,821
[45] Date of Patent: Jan. 5, 1999

[54] MATERIALS FOR SEMICONDUCTOR DEVICE ASSEMBLIES

[75] Inventors: Michael M. Chau; Donald A. Burkhart, both of San Diego, Calif.

[73] Assignee: Johnson Matthey, Inc., Valley Forge, Pa.

[21] Appl. No.: 577,256

[22] Filed: Dec. 22, 1995

[51] Int. Cl.⁶ ............................. H01B 1/22; C08K 3/34; C08K 3/36
[52] U.S. Cl. ......................... 252/514; 252/512; 524/442
[58] Field of Search .................................. 523/400, 401, 523/458, 466; 524/442; 252/511, 512, 514

[56] References Cited

U.S. PATENT DOCUMENTS

| | | | |
|---|---|---|---|
| 3,562,214 | 2/1971 | Kubens et al. | 260/47 |
| 4,604,644 | 8/1986 | Beckham et al. | 357/80 |
| 4,999,699 | 3/1991 | Christie et al. | 357/65 |
| 5,074,947 | 12/1991 | Estes et al. | 156/307 |
| 5,089,440 | 2/1992 | Christie et al. | 437/209 |
| 5,121,190 | 6/1992 | Hsiao et al. | 357/80 |
| 5,132,778 | 7/1992 | Juskey et al. | 357/72 |
| 5,330,684 | 7/1994 | Emori et al. | 252/512 |
| 5,646,241 | 7/1997 | Dershem et al. | 528/422 |

*Primary Examiner*—Mark Kopec
*Attorney, Agent, or Firm*—Christie, Parker & Hale, LLP

[57] ABSTRACT

A composition suitable for use as an underfill for an interconnection between a semiconductor device and a substrate, as a semiconductor device encapsulant, a dam, an adhesive for direct chip attachment, and as an electrical connection for semiconductor device and a substrate. The composition contains about 40 to 90 wt. % of an electrically conductive or non-conductive filler and a cyanate ester and epoxy resin component. The cyanate ester/epoxy resin component comprises about 10 to 70 wt. % cyanate ester material, about 30 to 90 wt. % of epoxy resin, about 0.1 to 1.5 wt. % metal chelate/amine solid curing catalyst and about 0.1 to 5 wt. % of a coupling agent.

14 Claims, 1 Drawing Sheet

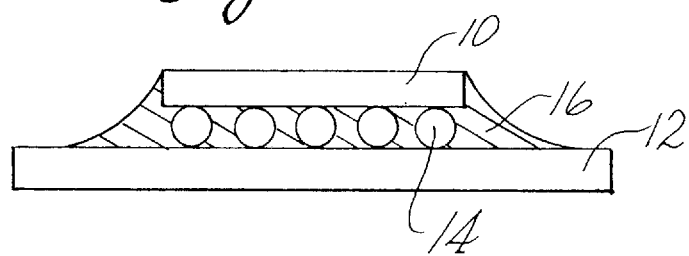
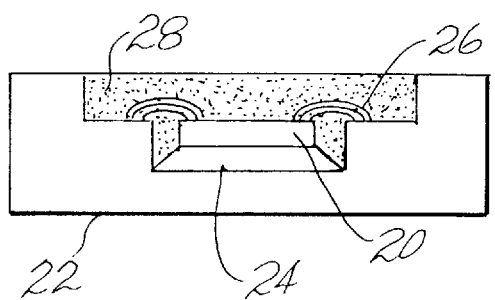
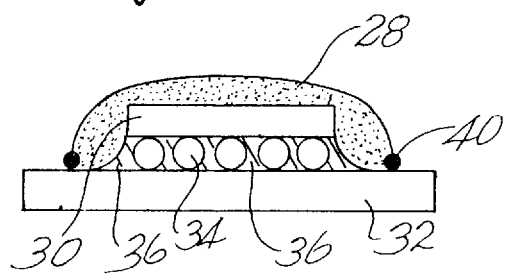

MATERIALS FOR SEMICONDUCTOR DEVICE ASSEMBLIES

BACKGROUND OF THE INVENTION

The present invention relates to materials for semiconductor device assemblies. More particularly, the present invention relates to interconnection systems between a semiconductor device or "die", sometimes referred to as a "chip", and substrates that employ interconnections in the form of "bumps", sometimes referred to as "controlled collapse chip connections" or "flip-chip" technology. The invention also relates to compositions for use as an underfill, as an encapsulant, as a dam, as a die attach adhesive and as an electrical connection for a semiconductor device.

Conventional semiconductor device packages or die attach systems generally involve adhering a die to a substrate with a die attach adhesive followed by wire bonding of the die or chip to the package to establish electrical connections. A hermetic package is then formed by sealing a lid to the substrate to hermetically seal the die in the package. However, as the complexity of semiconductor devices is increased and require larger number of electrical connections, the wire bonding step becomes a bottleneck in the manufacture of semiconductor devices as microprocessors.

Controlled collapse chip connections or flip chip assembly is seen as a way to avoid wire bonding and to facilitate manufacturing processes. By this technique, the semiconductor device is attached to a substrate using solder balls applied to the semiconductor device during the chip manufacturing process and the solder balls are then aligned with solder "bump pads", on the substrate prior to heating to elevated temperatures to cause solder flow and establish the interconnection. This technique enables more rapid continuous manufacturing of semiconductor assemblies and enhances the durability of the semiconductor device by decreasing the resistance and heat generation throughout the life cycle of the device.

One difficulty encountered in using the flip chip technology is that as the number of inlets and outlets (I/O), i.e., interconnection pins, bumps, etc., increases, the attachment or depositing of solder bumps to the semiconductor chips becomes more expensive. Screens or stencils with appropriate pattern and geometry can be used to print electronically conductive, low temperature thermostable paste of polymeric material onto a silicon wafer to provide thousands of bumps more economically in a short time. The uncured bumps can then be attached to the substrate followed by curing to form electrically conductive polymeric interconnections to replace the traditional solder bumps. However, although such polymeric interconnections function well, they are subject fatigue problems and lack durability as a result of the heating and cooling cycling of the semiconductor device as the microprocessors in which they are used are turned on and off. The present invention substantially reduces the stress on the semiconductor device interconnection, significantly increases durability, even when subjected to heating/cooling cycles, and improves moisture resistance.

SUMMARY OF THE INVENTION

In accordance with the invention there is provided a composition suitable for use as (1) an underfill between a semiconductor device and a substrate, (2) an encapsulant, (3) a "dam", and (4) an adhesive (both conductive and non-conductive) for direct chip attachment, and (5) as an electrical connection for a semiconductor device and a substrate. The composition comprises a cyanate ester and epoxy resin component sometimes referred to as "cyanate ester/epoxy resin compound, and about 40 to 90 wt. % of a filler. The cyanate ester/epoxy resin component comprises about 10 to 70 wt. %, advantageously about 30 to 70 wt. %, cyanate ester material, about 30 to 90 wt. % epoxy resin, about 0.1 to 1.5 wt. % curing catalyst, preferably a metal chelate and/or powder amine solid, and about 0.1 to 5 wt. % coupling agent. One embodiment comprises such composition as (1) a non-electrically conductive underfill, with a non-electrically conductive filler used for an interconnection between a semiconductor device and a substrate in a controlled collapse chip connection system, (2) an encapsulant, (3) a "dam" for a semiconductor device interconnection, and (4) a non-conductive adhesive for direct chip attachment. Another embodiment of the invention comprises an electrically conductive composition as a conductive adhesive for direct chip attachment, and (5) as an electrical interconnection for a controlled collapse chip connection system between the semiconductor device and a substrate, with electrically conductive filler. Thus, the composition may be made in both a non-electrically conductive form using non-electrically conductive fillers or in an electrically conductive form that incorporates electrically conductive fillers.

Another aspect of the invention is a semiconductor assembly that employs the above-described composition as an underfill, an encapsulant, a dam, a die attach adhesive, and an electrical interconnection. The invention contemplates the above-described composition as either or both a controlled collapse chip electrical connection (i.e. bump) and a non-electrically conductive underfill to support the chip connection, by including an electrically conductive or non-electrically conductive filler, respectively.

BRIEF DESCRIPTION OF THE DRAWINGS

FIG. 1 is a partial side elevation view of a controlled collapse chip connection, FIG. 2 is a partial side elevation view showing an encapsulated chip connection, and FIG. 3 is a partial side elevation showing another embodiment of an encapsulated chip connection.

DETAILED DESCRIPTION

The present composition for use as an underfill, encapsulant, dam, adhesive for direct chip attachment and/or as an electrically conductive interconnection component, is based upon epoxy-modified cyanate ester chemistry. By combining cyanate ester and epoxy resin, a composition may be formulated which takes advantage of the low viscosity of cyanate ester to enhance the flow characteristics of composition, thus making it advantageous as an underfill material. The resulting epoxy/cyanate co-polymer also exhibits substantially better moisture resistance as reflected by superior adhesion retention of the cured material after exposure to elevated temperatures in a 100% relative humidity, which is also attractive for the other above-described application.

Referring to the drawings, there is shown in FIG. 1 a controlled collapsed chip connection whereby a chip 10 is electrically connected to a substrate 12 by means of bumps 14, which may be made of solder or polymeric material. An underfill 16 provides support for the bumps 14 as later described.

An encapsulated chip connection is shown in FIG. 2 which describes a chip 20 bonded to package 22 with the die attach adhesive 24. Bonding wire 26 completes the electrical connection and the entire assembly is encapsulated with an encapsulant 28, also referred to as a "glob top".

Another embodiment is illustrated in FIG. 3 and in this example a chip 30 is electrically connected a substrate 32 through bumps 34. An underfill 36 as interposed between the bumps and the entire assembly is encapsulated with an encapsulant 38, retained in place by dam 40.

When an epoxy system (without cyanate ester) is used in a solder interconnection, the epoxy absorbs moisture then desorbs moisture completely during solder reflow which results in a delamination at interfaces. The delamination results from the a so-called "popcorn" effect caused by rapid release of vaporized moisture during fast heating during solder reflow process, which can involve heating at temperatures as high as 250° C. With the presence of cyanate ester, there is a tendency to retain the absorbed moisture by bonding it with trace residual cyanate ester groups present so that less moisture is desorbed and no delamination of the adhesive via "popcorn" effect occurs.

The "popcorn" effect refers to the production of voids, cracks, and delaminations caused by the rapid vaporization of absorbed moisture during high temperature solder reflow (e.g. about 250° C.) which escapes and causes cracking and delamination. Therefore, by incorporating cyanate ester with epoxy resin, moisture resistance is imparted to the composition by the presence of uncured epoxy functional groups. Thus, a composition combining epoxy resin and cyanate ester has the advantage of improved moisture resistance. When the cyanate ester is cured for bonding, the epoxy component is left relative uncured, or at least undercured, then damage due to hydrolysis, i.e., degrading of the cured polymer is repaired by the uncured epoxy component. A combination cyanate ester/epoxy resin is better than the epoxy or cyanate ester used alone in providing significant resistance to the "popcorn" effect and in improving flowability. Moreover, the combination results in a material that is more flexible, i.e., not as rigid, as a cyanate ester system that does not include epoxy resin. The cyanate ester contributes to improving the curing time required as compared to the time required for curing epoxy alone. The curing of the epoxy resin in the cyanate ester/epoxy resin system may be sped up by adding conventional epoxy curing catalyst(s), such as cyano-guanidine and Amicure UR, both of which can be obtained from Air Products (Allentown, Pa.).

As indicated previously, the composition is particularly useful in the application of flip-chip technology for interconnections having many input/output, i.e., "bumps", connecting silicon chips to substrates. Since some substrates are made of ceramic material, e.g., alumina, care must be exercised to avoid a significant difference in the coefficient of thermal expansion (CTE) with the substrate. For this reason, it may be desireable to adjust the CTE by the addition of a filler to the composition so that a better match is made with the CTE of the substrate. Thus, fillers may be used to minimize the thermal mismatch between the die (CTE about 3) and the substrate (plastic substrate CTE is about 20, alumina CTE is about 7). However, since the cyanate ester/epoxy resin component has a CTE of about 50, the CTE can be adjusted with filler to make a closer match with the CTE of the substrate.

It is possible to add supporting insulation by underfill between the bumps in certain applications. The low dielectric constant of cyanate ester complements the insulating capability of the underfill material which to prevent leakage of current, especially in high frequency devices. Preventing leakage improves the efficiency of the semiconductor device. Without such underfill, premature failure and separation of the connection between the bump and chip or substrate may result due to expansion and contraction during the on-off cycling of equipment in which such semiconductor devices are used, e.g. computers. Thus, use of an underfill will increase the life of the bump connection system and protect the bumps by alleviating stress on the bumps during use of the equipment.

The controlled collapse chip connection, i.e., flip-chip technology, is seen as a substitute for die attach technology that employs an adhesive to attach the die to a substrate wire bonding, and lid sealing for a hermetic environment. Application of flip-chip technology avoids the time consuming wire bonding step in this manufacturing process. The new composition of the invention provides still greater improvements since it may be used either as an electrical connection or as a non-conductive insulating material, but with the substantial advantage of being resistant to moisture, as manifested by not significantly affecting adhesion. Also, by improving the moisture resistance, corrosion of wire components is minimized or avoided and electrical conductivity of the assembly is not impaired.

The composition described also has good flow characteristics which is desireable when it is used as an underfill to fill in between the die, substrate and bumps. Fast, good flow characteristics result in a flow rate that avoids air entrapment. Air entrapment could lead to a "popcorn" effect, discussed above, and is responsible for uneven stress that leads to premature failure. Air entrapment is avoided by reducing the time required to fill the gaps between the bumps by capillary action due to the compositions good flow characteristics.

Although adjustment of the coefficient of thermal expansion is not as critical when using a cyanate ester/epoxy system because of its lower modulus, it is still desireable to adjust the CTE by the addition of fillers. For example, normally a silicon chip has a CTE of 3 ppm/°C. and metallic solder in a connection generally has a CTE of about 20 to 30 ppm/°C., whereas an alumina substrate will have a CTE of about 7 ppm/°C. and a plastic substrate would have a CTE of about 20 ppm/°C. The cyanate ester/epoxy resin composition can be made with a CTE of less than about 40 ppm/°C. and preferably less than 30 ppm/°C. using filler.

In a cyanate ester/epoxy resin composition, the curing temperature is substantially less, though temperature dependent. The curing temperature to be used depends upon the substrate, for example, with an alumina substrate the curing temperature is up to about 250° C. and with a plastic substrate the curing time is up to about 175° C. Therefore, it is desireable to provide a composition that is capable of being cured in less than about 175° C. in a reasonable time period, e.g. less than 90 minutes, to accommodate both alumina and plastic substrates. It is also desireable for the composition to have a glass transition temperature (Tg) greater than about 130° C. so as to have some rigidity and to be able to withstand the heating and cooling of a semiconductor assembly during on and off cycling of the equipment in which the semiconductor device is used.

The composition may be used as an underfill for metal solder interconnections or can be formulated with electrically conductive fillers for use as electrically conductive bump paste, thereby avoiding the need to use metal solders in such interconnections. The advantages of a cyanate ester-containing bump material is that it is more compatible with the composition used for the underfill. Moreover, the material is moisture resistant so that overall moisture resistance is enhanced.

Compositions in accordance with the invention comprise a cyanate ester/epoxy resin component and about 40 to 90 wt. % of filler, preferably 65 to 85 wt. %. The cyanate ester/epoxy component comprises about 10 to 70 wt. % cyanate ester material, about 30 to 90 wt. % epoxy resin, about 0.1 to 1.5 wt. % of curing catalyst, e.g. metal chelate and/or amine solids, and about 0.1 to 5 wt. % of a coupling agent. The coupling agent performs the function of a wetting agent to promote adhesion by lowering surface tension in a manner similar to surfactants. Thus, the coupling agent is included to enhance wetting of the substrate and the chip by the composition and to improve adhesion (i.e., retention of adhesion). The coupling agent also enhances flow characteristics. A preferred coupling agent is "Z6040" available from Dow Corning in Midland, Mich. Other coupling agents which are useful include organosilanes such as those available from Witco Chemical in Irvine, Calif. as A-174, A-186 and A-187.

The cyanate ester material may comprise a cyanate ester such as is available from Ciba Geigy of Hawthorne, N.Y., known as "AroCy L-10". However, low viscosity cyanate ester in the form of cyanate ester mixtures with two or more cyanate groups per molecule such as Ciba Geigy's AroCy L-10, B-10, M-10, or Dow Chemical's XU71787.02L, or Lonza's PT Resin, and mixtures of monofunctional cyanate esters and cyanate esters with more than two cyanate groups per molecule, may advantageously be used. Similarly, low viscosity bisphenol E, F, and A-based epoxy resin or epoxy resin mixtures with at least one, preferably two or more, epoxy groups per molecule, may advantageously also be used. The latter includes cycloaliphatic epoxy, aliphatic epoxy, and biphenyl epoxy. Suitable metal chelate curing catalysts are compounds of copper, cobalt, manganese, zinc, vanadium, chromium, iron and nickel but the presently preferred catalyst is copper acetylacetonate available from Shepherd Chemical of Cincinnati, Ohio (See Nguyen U.S. Pat. Nos. 5,150,195; 5,195,299,; 5,155,066; 5,250,600; 5,399,907; 5,371,178 and 5,386,000, the disclosures of which are hereby expressly incorporated herein by reference). Amine curing catalysts are preferably amine powders of less than 150 micron and the amine preferably has an active hydrogen equivalent weight of about 40 to 60 and an amine value of about 170 to 200. The epoxy resin can be "RSL1738" or "RSL1739" available from Shell in Houston, Tex. Non-electrically conductive fillers which may be used in underfill versions of the composition include boron nitride, silicon nitride, aluminum nitride, alumina, calcium carbonate, zirconium silicate and, most preferably, silica.

The following examples are provided to illustrate various embodiments of the invention.

EXAMPLE 1

A curing agent comprising copper acetylacetonate is dissolved in an epoxy resin at elevated temperatures until it becomes a homogeneous mixture after which it is cooled and one of the above-described coupling agents is added. The resulting mixture is blended with cyanate ester, warmed again and mixed until homogeneous, after which silica filler material is added to produce a paste. The paste is used to bond a 400×400 mil silicon die to an alumina substrate by curing the composition at 180° C. for 30 minutes. This material is evaluated against commercially available epoxy-based materials (Epoxy 1 and Epoxy 2) in Table 1. As can be seen, although the initial adhesion of the epoxy-based material in 100% humidity is greater, after curing, there is substantially little change in adhesion of the material of Example 1, indicating good adhesion retention, while the adhesion of the epoxy examples deteriorate substantially. In the column identified as Example 1, the dual numbers for initial adhesion, after 500 hours and after 1000 hours show results for curing schedules (1) and (2), respectively. Curing schedule (2) is the same for all three compositions. The considerable, and unexpected, improved adhesion of Example 1 as compared to the epoxy composition is strongly evident. Composite of Example 1 is suitable for use as a liquid encapsulant, or as non-conductive die attach material.

TABLE 1

|  | EXAMPLE 1 | EPOXY (1) | EPOXY (2) |
| --- | --- | --- | --- |
| Silica Filler | 74% | 71% | 74% |
| Cure | (1) 180° C./30'<br>(2) 125° C./30' +<br>165° C./90' | 125° C./30' +<br>165° C./90' | 128° C./30' +<br>165° C./90' |
| Initial Adhesion (lb) | 140/>223 | >223 | >223 |
| Adhesion After 500 hrs at 121° C./100% RH | 132/51 | 6 | 7 |
| Adhesion After 1000 hours at 121° C./100% RH | 136/39 | 4 | 5 |

EXAMPLE 2

In another example, a mixture of the cyanate ester/epoxy component described in Example 1 is mixed with particulate silver, e.g. flake (Chemed's EA0008), (however, silver powder may be also used), in a planetary mixer to form a paste. The paste is used to bond 600 mil×600 mil silicon dies to an alumina substrate by curing at 150° C. for 30 minutes. The resulting bonded die has an adhesion strength of 743 lb as measured by Instron stud pull. Upon exposure to 85° C./85% relative humidity in a humidity chamber, no adhesion loss is detected after 500, 1000, 1500 and 2000 hours. This material can be used as adhesive for direct chip attachment in non-hermetic environments such as surface mount technology, without a sealing lid. Surface mount technology includes use as an encapsulant and as a dam, (see FIGS. 2 and 3)

EXAMPLE 3

To illustrate the composition as a bump paste, cyanate ester is mixed with clay and silver flake in a planetary mixer after which triallyltriazinetrione and cobaltic acetylacetonate curing catalyst in an alkylphenol, in this case nonylphenol, are added, and mixed together. The resulting paste is used to print 6 mil diameter bumps with an aspect ratio of about 0.3 on 1 inch×1 inch on an alumina substrate using a stainless steel screen. A glass slide (700 mil×700 mil×8 mil) is then placed on top of the bumps and bonded at 150° C./30 minutes using a Connor Clip. The resulting gap between the alumina substrate and the glass slide is about 1 mil. Cyanate ester/epoxy resin component may also be used instead of cyanate ester.

EXAMPLE 4

In another example, the cyanate ester/epoxy resin composition of Example 1 is made into a paste by thinning the cyanate ester/epoxy resin component to 66% filler level with cyanate ester/epoxy resin, and used on a polymer bump structure as described in Example 3 (700 mil×700 mil×1 mil gap) on a hot plate at 70° C. After 5.5 minutes the gap is 95% filled. Under the same conditions, an epoxy-based material takes 20 minutes to fill 90% of the gap. This illustrates the good flowability characteristics by the cyanate ester/epoxy resin composition.

EXAMPLE 5

In another example, fumed silica is added to the cyanate ester/epoxy resin based paste of Example 1 to provide the proper rheology for use as a dam or liquid encapsulant.

EXAMPLE 6

In this example the composition of Example 1 is modified with about 1.5% Ancamine 2014AS which gives a rapid, i.e. snap curable, paste suitable for use as dam material or as a rapid curing die attach adhesive, i.e. capable of being cured in 5 minutes or less at 200° C.

It is apparent from the foregoing that various changes and modifications may be made without departing from the invention. Therefore, the scope of the invention should be limited only by the appended claims wherein

What is claimed is:

1. A composition suitable for use in a semiconductor device assembly comprising a cyanate ester and epoxy resin component and about 40 to 90 wt. % filler, said cyanate ester and epoxy resin component comprising about 10 to 70 wt. % cyanate ester material, about 30 to 90 wt. % epoxy resin, about 0.1 to 1.5 wt. % curing catalyst and about 0.1 to 5 wt. % coupling agent, wherein the epoxy resin is selected from the group consisting of bisphenol A-based epoxy resins, bisphenol E-based epoxy resins, bisphenol F-based epoxy resins, epoxy novalac and biphenyl epoxy, and wherein said composition is in the form of a paste at room temperature.

2. A composition according to claim 1 wherein said curing catalyst comprises a chelate of at least one of copper, cobalt, manganese, zinc, vanadium, chromium, iron and nickel.

3. A composition according to claim 1 wherein said curing catalyst comprises an amine solid.

4. A composition according to claim 1 wherein said curing catalyst comprises copper or cobaltic acetylacetonate, and which may contain an alkylphenol.

5. A composition according to claim 1 wherein said curing catalyst comprises powder of an amine with an active hydrogen equivalent weight of about 40 to 60 and an amine value of about 170 to 200.

6. A composition according to claim 5 wherein said curing catalyst comprises a powder having a particle size of less than 150 microns.

7. A composition according to claim 1 wherein said cyanate ester material comprises at least one from the group consisting of cyanate ester, cyanate ester mixtures with more than two cyanate groups per molecule, and mixtures of mono-functional cyanate esters and cyanate esters with more than two cyanate groups per molecule.

8. A composition according to claim 1 wherein said coupling agent comprises organosilane.

9. A compostion according to claim 1 wherein said filler comprises at least one of boron nitride, calcium carbonate, zirconium silicate, silicon nitride, alumina, aluminum nitride and silica.

10. A composition according to claim 1 wherein said filler comprises silica.

11. A composition according to claim 1 wherein said filler comprises an electrically conductive material.

12. A composition according to claim 11 wherein said filler comprises silver.

13. A composition according to claim 1, wherein said epoxy resin comprises at least one resin selected from the group consisting of bisphenol A-based epoxy resins, bisphenol E-based epoxy resins, and bisphenol F-based epoxy resins.

14. A composition according to claim 1, wherein the curing catalyst is a metal chelate.

* * * * *